(12) United States Patent
Choi et al.

(10) Patent No.: US 8,017,301 B2
(45) Date of Patent: Sep. 13, 2011

(54) PHOTOSENSITIVE POLYMER, RESIST COMPOSITION, AND ASSOCIATED METHODS

(75) Inventors: Sang-Jun Choi, Seoul (KR); Youn-Jin Cho, Anyang-si (KR); Seung-Wook Shin, Uiwang-si (KR); Hye-Won Kim, Uiwang-si (KR)

(73) Assignee: Cheil Industries, Inc., Gumi-si, Gyeongsangbuk-do (KR)

( * ) Notice: Subject to any disclaimer, the term of this patent is extended or adjusted under 35 U.S.C. 154(b) by 251 days.

(21) Appl. No.: 12/314,888

(22) Filed: Dec. 18, 2008

(65) Prior Publication Data
US 2009/0155720 A1 Jun. 18, 2009

(30) Foreign Application Priority Data
Dec. 18, 2007 (KR) .................. 10-2007-0133685

(51) Int. Cl.
G03F 7/004 (2006.01)
G03F 7/30 (2006.01)

(52) U.S. Cl. ............ 430/270.1; 430/326; 430/905; 430/910

(58) Field of Classification Search ............ 430/270.1, 430/326, 905, 910
See application file for complete search history.

(56) References Cited

U.S. PATENT DOCUMENTS

| 6,042,991 A | 3/2000 | Aoai et al. |
| 6,159,656 A | 12/2000 | Kawabe et al. |
| 6,303,266 B1 | 10/2001 | Okino et al. |
| 6,479,211 B1 | 11/2002 | Sato et al. |
| 6,710,148 B2 * | 3/2004 | Harada et al. ............ 526/245 |
| 7,186,495 B2 | 3/2007 | Maeda et al. |
| 7,601,479 B2 | 10/2009 | Tachibana et al. |
| 2006/0275697 A1 | 12/2006 | Hata et al. |
| 2007/0099113 A1 * | 5/2007 | Kobayashi et al. ......... 430/270.1 |

FOREIGN PATENT DOCUMENTS

| JP | 2000-019735 A | 1/2000 |
| JP | 2000-098614 A | 4/2000 |
| JP | 2000-147769 A | 5/2000 |
| JP | 2000-338680 A | 12/2000 |
| JP | 2002-234916 A | 8/2002 |
| JP | 2004-285077 A | 10/2004 |
| JP | 2005-220360 A | 8/2005 |
| KR | 10-1998-0029374 A | 7/1998 |
| KR | 10-1998-0071479 A | 10/1998 |
| KR | 10-2005-0027146 A | 3/2005 |
| KR | 10-0640643 B1 | 10/2006 |

* cited by examiner

*Primary Examiner* — John S Chu
(74) *Attorney, Agent, or Firm* — Lee & Morse, P.C.

(57) ABSTRACT

A photosensitive polymer, the photosensitive polymer including repeating units represented by Formulae 1 to 3:

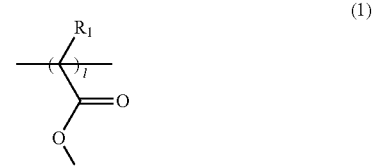

(1)

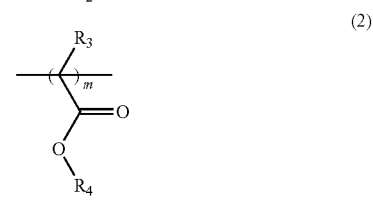

(2)

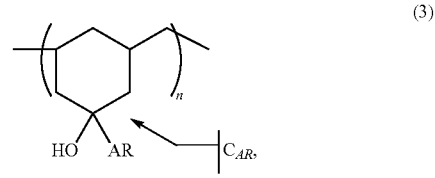

(3)

wherein $R_1$ and $R_3$ are independently hydrogen or methyl, $R_2$ is a C4 to C20 acid-labile group, $R_4$ is a lactone-derived group, AR is a substituted or unsubstituted phenyl ring, or a substituted or unsubstituted aryl having from two to three fused aromatic rings, carbon $C_{AR}$ is bonded directly to an aromatic ring of AR, l, m, and n are positive integers, $l/(l+m+n)$ is about 0.1 to about 0.5, $m/(l+m+n)$ is about 0.3 to about 0.5, and $n/(l+m+n)$ is about 0.1 to about 0.4.

15 Claims, 5 Drawing Sheets

Formula A:

(A)

Formula3 :

(3)

Formula 1:

Formula 2:

Formula 4:

Formula 5:

Reaction Scheme 1:

Reaction Scheme 2:

Reaction Scheme 3:

Formula 6:

(6)

Formula 7:

(7)

Formula 8:

(8)

PHOTOSENSITIVE POLYMER, RESIST COMPOSITION, AND ASSOCIATED METHODS

BACKGROUND OF THE INVENTION

1. Field of the Invention

Embodiments relate to a photosensitive polymer, a resist composition, and associated methods.

2. Description of the Related Art

For a photoresist material used to produce fine patterns, a deep-UV (deep UV) resist material using a shorter wavelength such that provided by an ArF excimer laser (193 nm) may be preferred to a resist material using a longer wavelength such as that provided by a KrF excimer laser (248 nm). For example, forming a semiconductor device with a capacity of more than 16 gigabytes needs a pattern size of less than 70 nm according to a design rule. As a result, a resist film may be thinner and have a reduced process margin for underlayer etching. The most representative problem is dry etching resistance of a photosensitive resin.

SUMMARY OF THE INVENTION

Embodiments are therefore directed to a photosensitive polymer, a resist composition, and associated methods, which substantially overcome one or more of the problems due to the limitations and disadvantages of the related art.

It is therefore a feature of an embodiment to provide a photosensitive polymer, a resist composition, and associated methods, which may be particularly useful in photoresist applications for lithographic processes in the 193 nm wavelength region or shorter.

At least one of the above and other features and advantages may be realized by providing A photosensitive (meth)acrylate polymer, the photosensitive (meth)acrylate polymer including repeating units represented by Formulae 1 to 3:

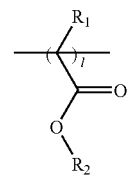

(1)

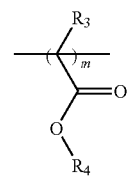

(2)

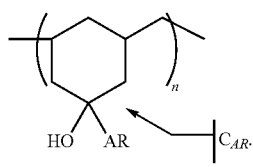

(3)

In Formulae 1 to 3, $R_1$ and $R_3$ may independently be hydrogen or methyl, $R_2$ may be a C4 to C20 acid-labile group, $R_4$ may be a lactone-derived group, AR may be a substituted or unsubstituted phenyl ring, or a substituted or unsubstituted aryl having from two to three fused aromatic rings, carbon $C_{AR}$ may be bonded directly to an aromatic ring of AR, l, m, and n may be positive integers, $l/(l+m+n)$ may be about 0.1 to about 0.5, $m/(l+m+n)$ may be about 0.3 to about 0.5, and $n/(l+m+n)$ maybe about 0.1 to 0.4.

AR may include first and second aromatic rings, the first and second aromatic rings being fused together, and the second aromatic ring may have a group $R_5$ that may be hydrogen, a halogen, an alkyl, an alkoxy, an aryl, or combinations thereof.

$R_2$ may include one or more of norbornyl, isobornyl, cyclodecanyl, adamantyl, norbornyl having a lower alkyl substituent, isobornyl having a lower alkyl substituent, cyclodecanyl having a lower alkyl substituent, adamantyl having a lower alkyl substituent, alkoxycarbonyl, alkoxycarbonylalkyl, amyloxycarbonyl, amyloxycarbonylalkyl, 2-tetrahydropyranyloxycarbonylalkyl, 2-tetrahydrofuranyloxycarbonylalkyl, a tertiary alkyl, or an acetal.

$R_4$ may be a substituent having the following Formulae 4 or 5.

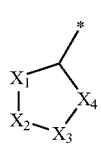

(4)

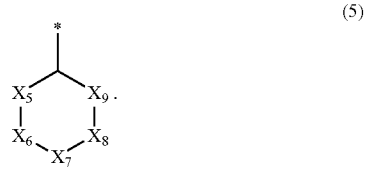

(5)

In Formula 4, at least two adjacent groups of $X_1$ to $X_4$ may independently be CO and O, and the remaining may be CR'', where R'' may be hydrogen, an alkyl, or an alkylene forming a fused ring with the five-member ring.

In Formula 5, at least two adjacent groups of $X_5$ to $X_9$ may independently be CO and O, the remaining may be CR'', where R'' may be hydrogen, an alkyl, or an alkylene forming a fused ring with the six-member ring, or all of $X_5$ to $X_9$ may be CR''', where R''' may be hydrogen, an alkyl, or an ester-containing alkylene forming a fused ring with the six-member ring, and at least two R''' may be linked to each other to form a lactone ring.

AR may be an unsubstituted naphthyl group having a ring carbon bonded directly to carbon $C_{AR}$.

The photosensitive polymer may have a weight average molecular weight about of 3,000 to about 30,000.

The photosensitive polymer may have a polydispersity of about 1.5 to about 2.5.

At least one of the above and other features and advantages may also be realized by providing a resist composition, including a photosensitive (meth)acrylate polymer of an embodiment, a photoacid generator, and a solvent.

The photosensitive polymer may be present in an amount of about 5 to about 15 parts by weight, based on 100 parts by weight of the resist composition.

The photoacid generator may be present in an amount of about 1 to about 15 parts by weight, based on 100 parts by weight of the photosensitive polymer.

The photoacid generator may include one or more of a triarylsulfonium salt, a diaryliodonium salt, or a sulfonate.

The resist composition may further include an organic base, wherein the organic base may be present in an amount of about 0.1 to about 1.0 part by weight, based on 100 parts by weight of the photosensitive polymer.

The organic base may include one or more of triethylamine, triisobutylamine, trioctylamine, triisodecylamine, or triethanolamine.

At least one of the above and other features and advantages may also be realized by providing a method of patterning a material, the method including forming a resist layer on the material, forming a resist pattern from the resist layer using a lithographic process, and patterning the material through the resist pattern, wherein the resist layer includes a photosensitive polymer, the photosensitive polymer including repeating units represented by Formulae 1 to 3:

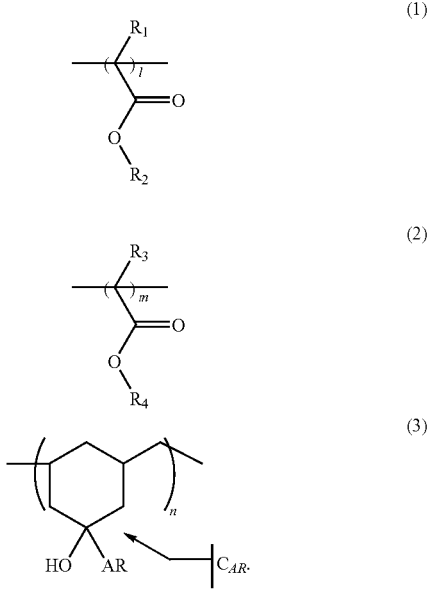

In Formulae 1 to 3, $R_1$ and $R_3$ are independently hydrogen or methyl, $R_2$ is a C4 to C20 acid-labile group, $R_4$ is a lactone-derived group, AR is a substituted or unsubstituted phenyl ring, or a substituted or unsubstituted aryl having from two to three fused aromatic rings, carbon $C_{AR}$ is bonded directly to an aromatic ring of AR, l, m, and n are positive integers, $l/(l+m+n)$ is about 0.1 to about 0.5, $m/(l+m+n)$ is about 0.3 to about 0.5, and $n/(l+m+n)$ is about 0.1 to 0.4.

The lithographic process used to form the pattern in the resist layer may use light having a wavelength of 193 nm or shorter.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
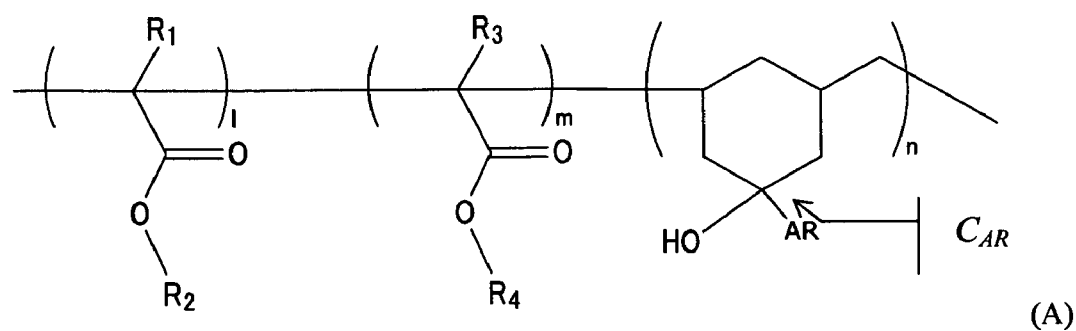
FIG. 1 illustrates Formula A.
Figure 2:
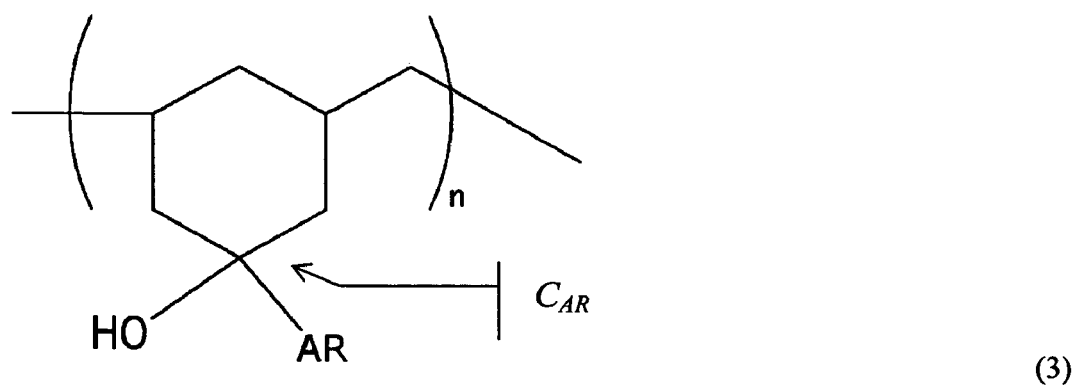
FIG. 2 illustrates Formula 3.
Figure 3:
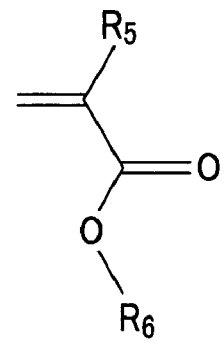
FIG. 3 illustrates Formulae 1, 2, 4, & 5.
Figure 3:
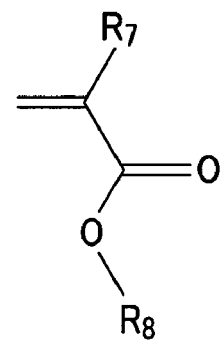
Figure 3:
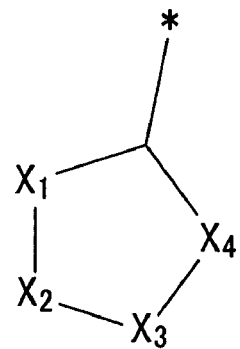
Figure 3:
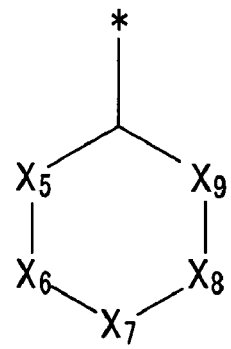
Figure 4:
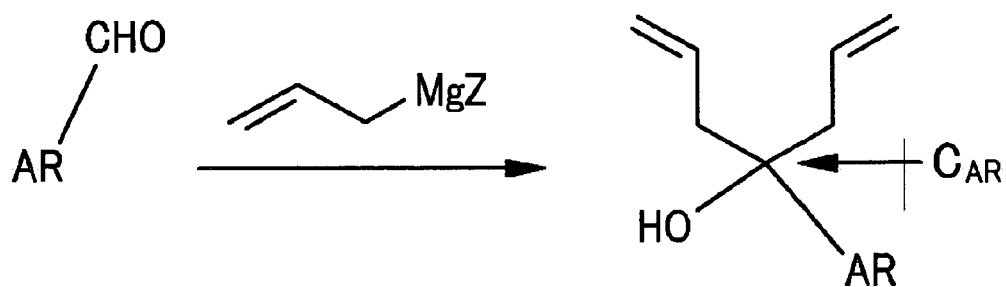
FIG. 4 illustrates Reaction Schemes 1-3.
Figure 4:
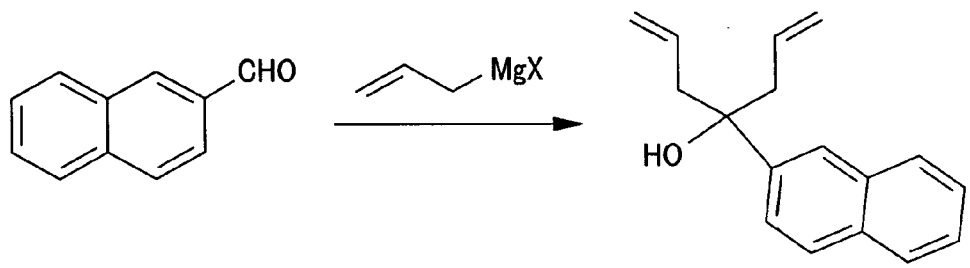
Figure 4:
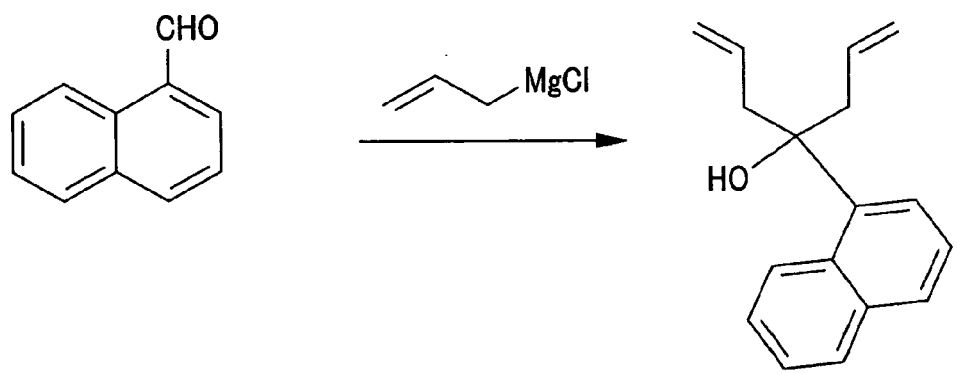
Figure 5:
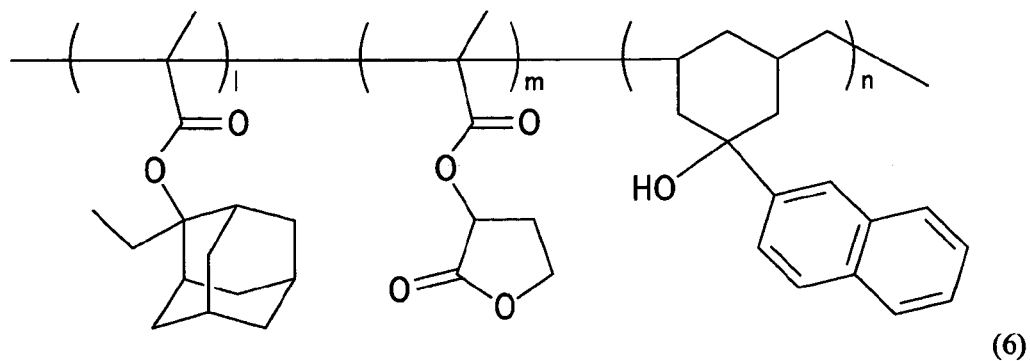
FIG. 5 illustrates Formulae 6-8.
Figure 5:
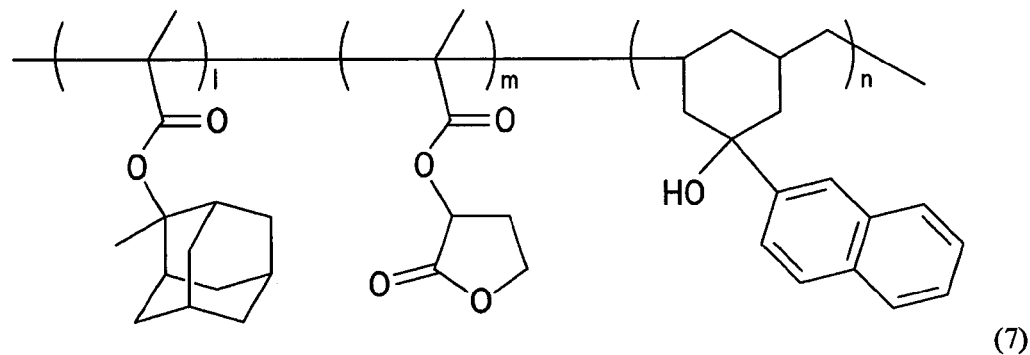
Figure 5:
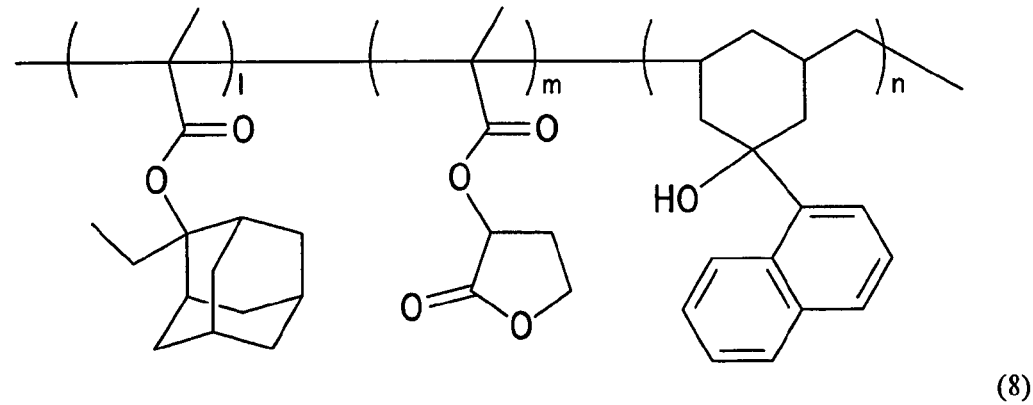

Korean Patent Application No. 10-2007-0133685, filed on Dec. 18, 2007, in the Korean Intellectual Property Office, and entitled: "Photosensitive Polymers and Resist Composition Including Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B, and C together, whereas the expression "either A, B, or C" means one of A alone, B alone, and C alone, and does not mean any of both A and B together; both A and C together; both B and C together; and all three of A, B, and C together.

As used herein, the terms "a" and "an" are open terms that may be used in conjunction with singular items or with plural items. For example, the term "an organic base" may represent a single compound, e.g., triethyl amine, or multiple compounds in combination, e.g., triethyl amine mixed with triethanolamine.

As used herein, molecular weights of polymeric materials are weight average molecular weights, unless otherwise indicated.

As used herein, the term "(meth)acrylate" refers to both acrylate and methacrylate. Thus, for example, the term ethyl (meth)acrylate refers to both ethyl acrylate and ethyl methacrylate. Further, the term "acrylate" is generic to both acrylate and methacrylate, unless specified otherwise. Thus, ethyl acrylate and ethyl methacrylate are both acrylates.

As used herein, unless specified otherwise, the term "an alkyl" refers to a C1 to C20 alkyl and preferably a C1 to C12 alkyl, the term "a lower alkyl" refers to a C1 to C4 alkyl, the term "an alkoxy" refers to a C1 to C20 alkoxy and preferably a C1 to C12 alkoxy, the term "an alkylene" refers to a C1 to C20 alkylene and preferably a C1 to C12 alkylene, and the term "an aryl" refers to a C6 to C20 aryl and preferably a C6 to C12 aryl.

According to an embodiment, a photosensitive polymer may be represented by the following Formula A:

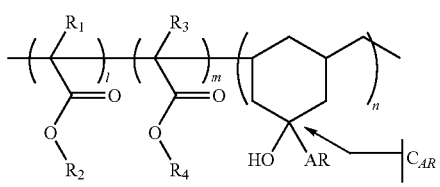
(A)

The photosensitive polymer represented by Formula A may include repeating units represented by the following Formulae 1 to 3:

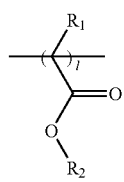
(1)

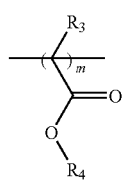
(2)

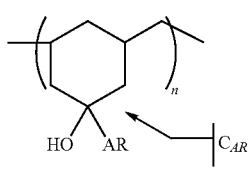
(3)

In Formulae 1 and 2, $R_1$ and $R_3$ may independently be hydrogen or methyl.

In Formula 1, $R_2$ may be a C4 to C20 acid-labile group and may include one or more of norbornyl, isobornyl, cyclodecanyl, adamantyl, norbornyl having a lower alkyl substituent, isobornyl having a lower alkyl substituent, cyclodecanyl having a lower alkyl substituent, adamantyl having a lower alkyl substituent, alkoxycarbonyl, alkoxycarbonylalkyl, amyloxycarbonyl, amyloxycarbonylalkyl, 2-tetrahydropyranyloxycarbonylalkyl, 2-tetrahydrofuranyloxycarbonylalkyl, a tertiary alkyl, an acetal, or combinations thereof. In another embodiment, is 2-methyl-2-norbornyl, 2-ethyl-2-norbornyl, 2-methyl-2-isobornyl, 2-ethyl-2-isobornyl, 8-methyl-8-tricyclodecanyl, 8-ethyl-8-tricyclodecanyl, 2-methyl-2-adamantyl, 2-ethyl-2-adamantyl, 2-propyl-2-adamantyl, t-butoxycarbonyl, t-butoxycarbonylmethyl, t-amyloxycarbonyl, t-amyloxycarbonylmethyl, 1-ethoxyethoxycarbonylmethyl, 2-tetrahydropyranyloxycarbonylalkyl, 2-tetrahydrofuranyloxycarbonylalkyl, t-butyl, triethylcarbyl, 1-methyl cyclohexyl, 1-ethylcyclopentyl, t-amyl, or an acetal.

In Formula 2, $R_4$ may be a lactone-derived group, and may include at least one of Formulae 4 or 5.

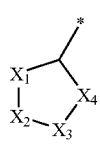
(4)

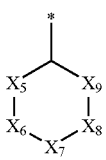
(5)

In Formula 4, at least two adjacent groups of $X_1$ to $X_4$ may independently be CO and O, and the remaining are CR" (where R" is hydrogen, an alkyl, or an alkylene forming a fused ring with the five-member ring).

In Formula 5, at least two adjacent groups of $X_5$ to $X_9$ may independently be CO and O, the remaining are CR" (where R" is hydrogen, an alkyl, or an alkylene forming a fused ring with the six-member ring), or all of $X_5$ to $X_9$ are CR''' (where R''' is hydrogen, an alkyl, or an ester-containing alkylene forming a fused ring with the six-member ring) and at least two R''' are linked to each other to form a lactone ring.

In an embodiment, $R_4$ may be butyrolactonyl, valerolactonyl, 1,3-cyclohexanecarbolactonyl, 2,6-norbomanecarbolacton-5-yl, or 7-oxa-2,6-norbomanecarbolacton-5-yl.

In Formula 3, AR may be a substituted or unsubstituted phenyl, or an aryl having from two to three fused aromatic rings. The fused aromatic rings may be substituted or unsubstituted. In an implementation, the fused aromatic ring bonded directly to carbon $C_{AR}$ may be unsubstituted, while a substituent R5 may be present on an adjacent fused aromatic ring. $R_5$ may be hydrogen, halogen, an alkyl, an alkoxy, an aryl, or combinations thereof.

In the photosensitive polymer, $l/(l+m+n)=0.1$ to 0.5, $m/(l+m+n)=0.3$ to 0.5, and $n/(l+m+n)=0.1$ to 0.4.

In Formula 1, $R_5$ may be hydrogen. In Formula 1, x may be 1 where the compound includes a naphthyl group, i.e., a naphthalene-derived group.

A monomer with an aromatic substituent having a tertiary alcohol group, which provides a repeating unit of Formula 3 of a photosensitive polymer of an embodiment, may be prepared through Grignard reaction of Grignard reagents of allyl magnesium halide with various aromatic aldehyde compounds.

The following Reaction Scheme 1 illustrates a preparation process of a monomer having aromatic substituent having a tertiary alcohol group, which may constitute the photosensitive polymer of an embodiment.

As shown in the following Reaction Scheme 1, Grignard reagents of allyl magnesium halide, e.g., allyl magnesium bromide or allyl magnesium chloride may be reacted through Grignard reaction with various aromatic aldehyde compounds to prepare a monomer with an aromatic substituent having a tertiary alcohol group.

[Reaction Scheme 1]

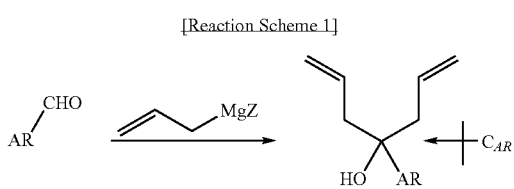

In Reaction Scheme 1, Z may be a halogen, $R_5$ may be hydrogen, a halogen, an alkyl, an alkoxy, an aryl, or combination thereof. AR may be a substituted or unsubsituted phenyl, or an aryl having from two to three fused aromatic rings. The fused aromatic rings may be substituted or unsubstituted. In an implementation, the fused aromatic ring bonded directly to carbon $C_{AR}$ may be unsubstituted, while a substituent R5 may be present on an adjacent fused aromatic ring. $R_5$ may be hydrogen, halogen, an alkyl, an alkoxy, an aryl, or combinations thereof. In Reaction Scheme 1, x may be an integer of 0 to 2, i.e., the aryl group may be a phenyl (x=0), naphthyl (x=1), etc.

The photosensitive copolymer may have a polydispersity (ratio of weight average molecular weight to number average molecular weight, i.e., Mw/Mn) of about 1.5 to about 2.5, which may provide excellent etching resistance and resolution.

The photosensitive polymer according to an embodiment may be a copolymer obtained from new functional aromatic compounds, so it may have the advantages of providing a resist composition having both excellent adhesion to an underlayer and excellent dry etching resistance. These monomers are aromatic compounds having a tertiary alcohol group synthesized through Grignard reaction, so that they may simultaneously have improved adherence characteristic and etching resistance against a layer. Accordingly, a photosensitive polymer according to an embodiment may overcome the drawbacks of known ArF resist materials with respect to dry etching resistance. Thus, the photosensitive polymer according to an embodiment may be useful for forming an etching mask in a process of manufacturing a semiconductor device that requires a high resolution.

Another embodiment provides a resist composition including the photosensitive polymer.

The resist composition may include a photosensitive polymer according to an embodiment, a photoacid generator (PAG), and a solvent.

Hereinafter, the components of the resist composition according to one embodiment of the present invention are described in more detail.

Photosensitive Polymer

The photosensitive polymer according to an embodiment is described above. The photosensitive polymer may be included in an amount of about 5 to about 15 parts by weight based on 100 parts by weight of the resist composition, which may provide the resist composition with excellent etching resistance and adhesion characteristics.

Photoacid Generator (PAG)

The photoacid generator may include an inorganic onium salt, organic sulfonate, or mixtures thereof. Specific examples of the photoacid generator include sulfonate or iodonium salt including a triarylsulfonium salt, a diaryl iodonium salt, sulfonate, or mixtures thereof. Preferable examples of the photoacid generator include triarylsulfonium triflate, diaryliodonium triflate, triarylsulfonium nonaflate, diaryliodonium nonaflate, succinimidyl triflate, 2,6-dinitrobenzyl sulfonate, or mixtures thereof.

The photoacid generator may be added at about 1 to about 15 parts by weight based on 100 parts by weight of the copolymer. Providing about 1 part by weight or more may help ensure that excessive exposure is not required. Providing about 15 parts by weight or less may help avoid decreases in the light transmission of the resist composition.

Solvent

The solvent may include, e.g., propylene glycol monomethyl ether acetate (PGMEA), propylene glycol methyl ether (PGME), ethyl lactate (EL), cyclohexanone, 2-heptanone, etc.

The solvent may be added as the balance amount of the resist composition. In an embodiment, the solvent may be added at about 80 wt % to about 95 wt %, based on 100 parts by weight of the entire resist composition.

Additive

The resist composition may further include an organic base (amine quencher) in order to control the exposure amount and to form a resist profile. The organic base may include, e.g., triethylamine, triisobutylamine, trioctylamine, triisodecylamine, triethanolamine, or mixtures thereof.

The amount of organic base may be about 0.1 to about 1 part by weight based on 100 parts by weight of the polymer. Providing about 0.1 parts by weight or more may help ensure a significant effect. Providing about 1 part by weight or less may help avoid undue increase in the amount of exposure required. Further, excessive organic base may impede pattern formation.

A process for forming a pattern using a resist composition according to an embodiment will now be described.

A bare silicon wafer or a silicon wafer including a layer such as a silicon oxide layer, a silicon nitride layer, or a silicon nitride oxide layer on the upper surface thereof may be treated, e.g., with HMDS (hexamethyldisilazane) or an organic anti-reflection coating (bottom anti-reflective coating). Thereafter, the resist composition according to an embodiment may be coated on the silicon wafer to form a resist layer having a thickness of, e.g., about 100 nm to about 150 nm.

The silicon wafer formed with the resist layer may be prebaked, e.g., at a temperature of about 90 to about 120° C. for about 60 to about 90 seconds to remove solvent. A resist pattern may be formed from the resist layer using a process that includes, e.g., exposure to an exposure light source. The light source may be, e.g., ArF or EUV (extreme UV), E-beam, etc. In order to drive the chemical reaction in the exposed region of the resist layer, the layer may be subjected to PEB (post-exposure baking), e.g., at a temperature of about 90 to about 120° C. for about 60 to about 90 seconds.

Then the resist layer may be developed, e.g., in a basic aqueous developing solution such as TMAH (tetramethylammonium hydroxide) solution. The exposed region may have a very high solubility in the basic aqueous developing solution, so it may be easily dissolved and removed during the development. When the exposure light source is an ArF excimer laser, an 80 to 100 nm line and space pattern may be obtained at an exposure dose of about 10 to about 40 mJ/cm$^2$.

The resist pattern obtained from the above lithographic process may be used as a mask to pattern an underlying layer, e.g., an underlying silicon oxide layer, by using an etchant, e.g., a plasma of halogen gas or $C_xF_y$ gas such as a perfluorinated alkane in which x is a positive integer and y=2x+2. The resist pattern that remains on the wafer may then be removed by using a stripper to yield a desired pattern in the target material layer, e.g., a silicon oxide layer pattern.

The following examples are provided in order to set forth particular details of one or more example embodiments.

However, it will be understood that the embodiments described herein are not limited to the particular details described in the examples.

SYNTHESIS EXAMPLE 1

Synthesis of 4-(naphthalen-2yl)hepta-1,6-dien-4-ol

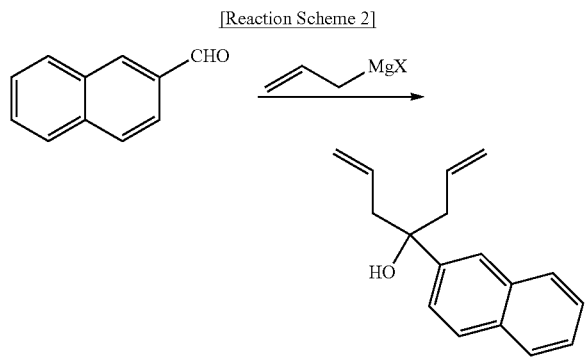

[Reaction Scheme 2]

A 4-(naphthalen-2yl)hepta-1,6-dien-4-ol monomer was synthesized according to the method as in shown in Reaction Scheme 2.

First, 16 g of 2-naphthaldehyde was dissolved in 150 mL of THF, and 150 mL of allyl magnesium chloride (a 2.0 M THF solution) was slowly added thereto. The resulting mixture was reacted at a temperature of about 45° C. for 8 hours. After the reaction, the reactant was slowly neutralized in an extreme amount of thin hydrochloric acid solution. Then, the extract was extracted therefrom using diethyl ether and purified through column chromatography (hexane:ethyl acetate=3:1), preparing 10 g of 4-(naphthalen-2yl)hepta-1,6-dien-4-ol monomer (yield: 42%).

SYNTHESIS EXAMPLE 2

Synthesis of a 4-(naphthalen-1-yl)hepta-1,6-dien-4-ol)monomer

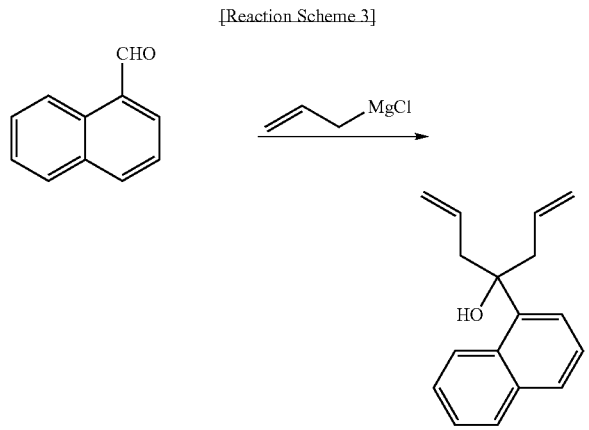

[Reaction Scheme 3]

A 4-(naphthalen-1-yl)hepta-1,6-dien-4-ol monomer was synthesized according to the same method as in shown in Reaction Scheme 3.

The 4-(naphthalen-1-yl)hepta-1,6-dien-4-ol 2 was prepared according to the same method as in Synthesis Example 1 using 1-naphthaldehyde instead of 2-naphthaldehyde (yield: 40%).

EXAMPLE 1

Synthesis of a Photosensitive Polymer 25 mmol of the monomer according to Synthesis Example 1 and 5 mmol of V601 (Wako Pure Chemicals Industries Ltd.) as a polymerization initiator were dissolved in a MEK (methyl ethyl ketone) solvent (in a double weight of the entire weight of the monomer). The solution was degassed using $N_2$ gas for about 30 minutes and then, stirred at 80° C. Next, 40 mmol of 2-ethyl-2-adamantyl methacrylate (EAMA) and 35 mmol of γ-butyrolactonyl methacrylate (GBLMA) were dissolved in a small amount of THF. This solution was slowly dropped to the above resulting product for about one hour. The mixture was polymerized for about 4 hours.

After the polymerization, the reactant was slowly precipitated in an excess of diethylether solvent. The precipitate was filtered and then dissolved in THF and reprecipitated in diethylether. The acquired precipitate was dried in a 50° C. vacuum oven for about 24 hours, yielding a polymer represented by following Formula 6 with a yield percent of 50%. Herein, the copolymer has a weight average molecular weight (Mw) of 7,800 and a polydispersity (Mw/Mn) of 1.8.

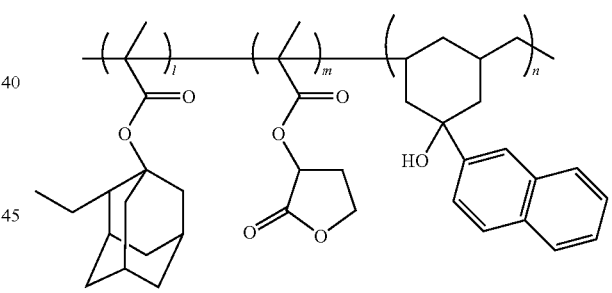

(6)

In Formula 6, l=40, m=35, and n=25.

EXAMPLE 2

Synthesis of a Photosensitive Polymer 40 mmol of 2-Methyl-2-adamantyl methacrylate (MAMA), 35 mmol of γ-butyrolactonyl methacrylate (GBLMA), and 25 mmol of the monomer according to Synthesis Example 1 were polymerized according to the same method as in Example 1 to prepare a polymer represented by the following formula 7 (yield: 45%). Herein, the prepared copolymer has a weight average molecular weight (Mw) of 7,500 and a polydispersity (Mw/Mn) of 1.8.

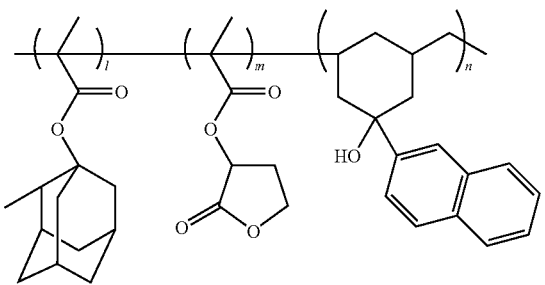

(7)

In Formula 7, l=40, m=35, and n=25.

EXAMPLE 3

Synthesis of a Photosensitive Polymer 40 mmol of 2-Ethyl-2-adamantyl methacrylate (EAMA), 35 mmol of -butyrolactonyl methacrylate (GBLMA), and 25 mmol of the monomer according to Synthesis Example 2 were polymerized according to the same method as in Example 1 to prepare a polymer represented by the following Formula 8 (yield: 50%). Herein, the prepared copolymer has a weight average molecular weight (Mw) of 8,300 and a polydispersity (Mw/Mn) of 1.8.

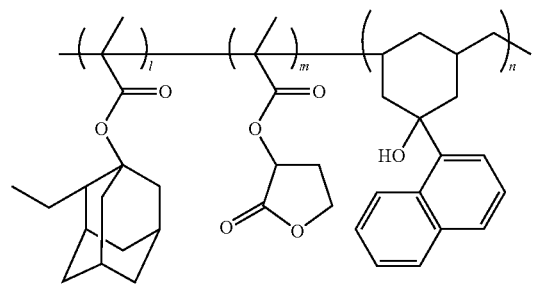

(8)

In Formula 8, l=40, m=35, and n=25.

EXAMPLE 4

Preparation of a Resist Composition and Lithography Performance 1 g of each of the polymers according to Examples 1 to 3 were respectively dissolved with 0.03 g of triphenyl sulfonium (TPS) nonaflate PAG in 17 g of PGMEA/EL mixed in a ratio of 6/4, and 2 mg of triethanolamine as an organic base was added and completely dissolved to prepare a resist composition.

EXPERIMENTAL EXAMPLE 1

Resolution Evaluation

The resist composition of Example 4 was filtered using a 0.1 μm thick membrane filter. A silicon wafer treated with organic BARC (AR46, Rohm and Haas Company) to a thickness of 600 Å and soft-baked (SB) at a temperature of 110° C. for 60 seconds is coated with the filtered resist composition to a thickness of 120 mm. The so-coated silicon wafer was then exposed to light with an ArF scanner (0.78 NA, dipole), then post-exposure baked (PEB), and then developed in a 2.38 wt % TMAH solution for 60 seconds. As a result, a 80 to 100 nm L/S (line and space) pattern was produced at a dose of about 10 to 40 mJ/cm$^2$.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A photosensitive polymer, the photosensitive polymer including repeating units represented by Formulae 1 to 3:

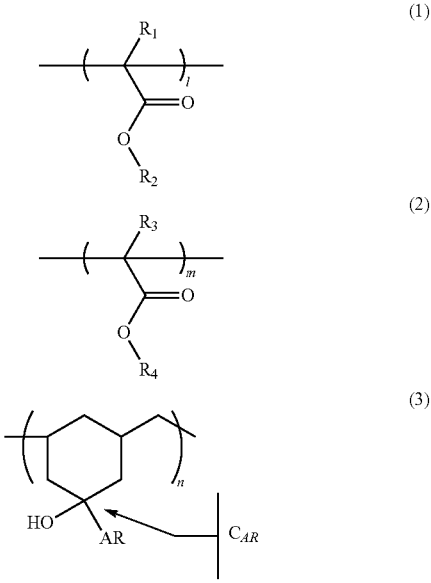

wherein, in Formulae 1 to 3:
$R_1$ and $R_3$ are independently hydrogen or methyl,
$R_2$ is a C4 to C20 acid-labile group,
$R_4$ is a lactone-derived group,
AR is a substituted or unsubstituted phenyl ring, or a substituted or unsubstituted aryl having from two to three fused aromatic rings,
carbon $C_{AR}$ is bonded directly to an aromatic ring of AR,
l, m, and n are positive integers,
l/(l+m+n) is about 0.1 to about 0.5,
m/(l+m+n) is about 0.3 to about 0.5, and
n/(l+m+n) is about 0.1 to 0.4.

2. The polymer as claimed in claim 1, wherein:
AR includes first and second aromatic rings, the first and second aromatic rings being fused together, and
the second aromatic ring has a group $R_5$ that is hydrogen, a halogen, an alkyl, an alkoxy, an aryl, or combinations thereof.

3. The polymer as claimed in claim 1, wherein $R_2$ includes one or more of norbornyl, isobornyl, cyclodecanyl, adamantyl, norbornyl having a lower alkyl substituent, isobornyl having a lower alkyl substituent, cyclodecanyl having a lower alkyl substituent, adamantyl having a lower alkyl substituent, alkoxycarbonyl, alkoxycarbonylalkyl, amyloxycarbonyl, amyloxycarbonylalkyl, 2-tetrahydropyranyloxycarbonylalkyl, 2-tetrahydrofuranyloxycarbonylalkyl, a tertiary alkyl, or an acetal.

4. The polymer as claimed in claim 1, wherein:
$R_4$ is a substituent having the following Formulae 4 or 5

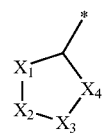

(4)

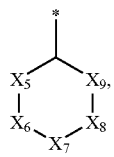

(5)

in Formula 4, at least two adjacent groups of $X_1$ to $X_4$ are independently CO and O, and the remaining are CR", where R" is hydrogen, an alkyl, or an alkylene forming a fused ring with the five-member ring, and in Formula 5:
at least two adjacent groups of $X_5$ to $X_9$ are independently CO and O, the remaining are CR", where R" is hydrogen, an alkyl, or an alkylene forming a fused ring with the six-member ring, or
all of $X_5$ to $X_9$ are CR'", where R'" is hydrogen, an alkyl, or an ester-containing alkylene forming a fused ring with the six-member ring, and at least two R'" are linked to each other to form a lactone ring.

5. The polymer as claimed in claim 1, wherein AR is an unsubstituted naphthyl group having a ring carbon bonded directly to carbon $C_{AR}$.

6. The polymer as claimed in claim 1, wherein the photosensitive polymer has a weight average molecular weight about of 3,000 to about 30,000.

7. The polymer as claimed in claim 1, wherein the photosensitive polymer has a polydispersity of about 1.5 to about 2.5.

8. A resist composition, comprising:
a photosensitive polymer as claimed in claim 1,
a photoacid generator, and
a solvent.

9. The resist composition as claimed in claim 8, wherein the photosensitive polymer is present in an amount of about 5 to about 15 parts by weight, based on 100 parts by weight of the resist composition.

10. The resist composition as claimed in claim 8, wherein the photoacid generator is present in an amount of about 1 to about 15 parts by weight, based on 100 parts by weight of the photosensitive polymer.

11. The resist composition as claimed in claim 8, wherein the photoacid generator includes one or more of a triarylsulfonium salt, a diaryliodonium salt, or a sulfonate.

12. The resist composition as claimed in claim 8, further comprising an organic base, wherein the organic base is present in an amount of about 0.1 to about 1.0 part by weight, based on 100 parts by weight of the photosensitive polymer.

13. The resist composition as claimed in claim 12, wherein the organic base includes one or more of triethylamine, triisobutylamine, trioctylamine, triisodecylamine, or triethanolamine.

14. A method of patterning a material, the method comprising:
forming a resist layer on the material;
forming a resist pattern from the resist layer using a lithographic process; and
patterning the material through the resist pattern, wherein:
the resist layer includes a photosensitive polymer, the photosensitive polymer including repeating units represented by Formulae 1 to 3:

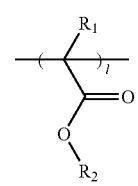

(1)

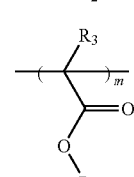

(2)

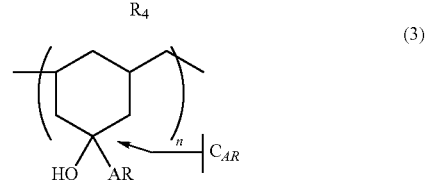

(3)

and, in Formulae 1 to 3:
$R_1$ and $R_3$ are independently hydrogen or methyl,
$R_2$ is a C4 to C20 acid-labile group,
$R_4$ is a lactone-derived group,
AR is a substituted or unsubstituted phenyl ring, or a substituted or unsubstituted aryl having from two to three fused aromatic rings,
carbon $C_{AR}$ is bonded directly to an aromatic ring of AR,
l, m, and n are positive integers,
$l/(l+m+n)$ is about 0.1 to about 0.5,
$m/(l+m+n)$ is about 0.3 to about 0.5, and
$n/(l+m+n)$ is about 0.1 to 0.4.

15. The method as claimed in claim 14, wherein the lithographic process used to form the pattern in the resist layer uses light having a wavelength of 193 nm or shorter.

* * * * *